(12) United States Patent
Fujiwara et al.

(10) Patent No.: US 11,381,237 B2
(45) Date of Patent: Jul. 5, 2022

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventors: Yasuyuki Fujiwara, Yokohama Kanagawa (JP); Yiyao Liu, Saitama Saitama (JP); Yusuke Sato, Kanagawa (JP); Naotsugu Kako, Yokohama Kanagawa (JP); Hideaki Majima, Tokyo (JP)

(73) Assignees: KABUSHIKI KAISHA TOSHIBA, Tokyo (JP); TOSHIBA ELECTRONIC DEVICES & STORAGE CORPORATION, Tokyo (JP)

(*) Notice: Subject to any disclaimer, the term of this patent is extended or adjusted under 35 U.S.C. 154(b) by 0 days.

(21) Appl. No.: 17/204,003

(22) Filed: Mar. 17, 2021

(65) Prior Publication Data
US 2022/0094353 A1 Mar. 24, 2022

(30) Foreign Application Priority Data
Sep. 18, 2020 (JP) .............................. JP2020-157674

(51) Int. Cl.
*H03K 17/693* (2006.01)
*H03K 17/22* (2006.01)
(52) U.S. Cl.
CPC ......... *H03K 17/223* (2013.01); *H03K 17/693* (2013.01)

(58) Field of Classification Search
CPC .................. H02M 3/158; H02M 3/337; H03K 17/08104; H03K 17/74; H03K 17/102; H03K 17/223; H03K 17/693; H03K 17/6871; H03K 17/567; H03K 2017/6875; H03K 2017/066
See application file for complete search history.

(56) References Cited

U.S. PATENT DOCUMENTS 9,203,393 B2 12/2015 Takasu et al.
2017/0264286 A1* 9/2017 Goto .................... H03K 17/687
2018/0145674 A1 5/2018 Bunin et al.

FOREIGN PATENT DOCUMENTS

JP 2014-50179 A 3/2014
JP 2014-193022 A 10/2014
JP 2017-118630 A 6/2017

* cited by examiner

*Primary Examiner* — Sibin Chen
(74) *Attorney, Agent, or Firm* — Allen & Overy LLP

(57) ABSTRACT

A semiconductor device that normally-off drives a first transistor that normally-on drives, the semiconductor device includes a first circuitry, a second circuitry, and a first diode. The first circuitry that is connected with a power supply voltage and a ground voltage, detects the power supply voltage, and outputs a transition state of the power supply voltage. The second circuitry that is connected with the power supply voltage, the ground voltage, the first circuitry, and a second transistor, and outputs a drive voltage of a second transistor connected in series with the first transistor, based on an output of the first circuitry. The first diode having an anode connected with a drive terminal of the first transistor and a cathode connected with an output terminal of the second transistor.

5 Claims, 13 Drawing Sheets

SEMICONDUCTOR DEVICE

CROSS REFERENCE TO RELATED APPLICATION

This application is based upon and claims the benefit of priority from the prior Japanese Patent Application No. 2020-157674, filed on Sep. 18, 2020, the entire contents of which are incorporated herein by reference.

FIELD

Embodiments of the present invention relate to a semiconductor device.

BACKGROUND

A power device using GaN (gallium nitride) has advantages such as higher switching speed, lower recovery loss, and faster charge/discharge of output capacity, as compared with a metal-oxide-semiconductor field-effect transistor (MOSFET) using silicon (Si). Transistors using GaN are mostly normally-on type in general, but development has been widely conducted to use these advantages as normally-off type transistors.

However, such a circuit that converts into normally-off type has the following problems: the gate drive capability cannot be adjusted by the conversion circuit; a dedicated negative power supply circuit and a dedicated gate driver are required; a gate current loop becomes long via an n-type MOSFET; or a trade-off between erroneous ON prevention and standby power when the gate driver power supply is turned off is large.

DETAILED DESCRIPTION

According to one embodiment, a semiconductor device that normally-off drives a first transistor that normally-on drives, the semiconductor device includes a first circuitry, a second circuitry, and a first diode. The first circuitry that is connected with a power supply voltage and a ground voltage, detects the power supply voltage, and outputs a transition state of the power supply voltage. The second circuitry that is connected with the power supply voltage, the ground voltage, the first circuitry, and a second transistor, and outputs a drive voltage of a second transistor connected in series with the first transistor, based on an output of the first circuitry. The first diode having an anode connected with a drive terminal of the first transistor and a cathode connected with an output terminal of the second transistor.

And, the first circuitry and the second circuitry do not require an external input signal to drive the first transistor normally-off.

An embodiment will be described below with reference to the drawings. In the figures, D indicates the position of drain unless otherwise specified.

First Embodiment

Figure 1:
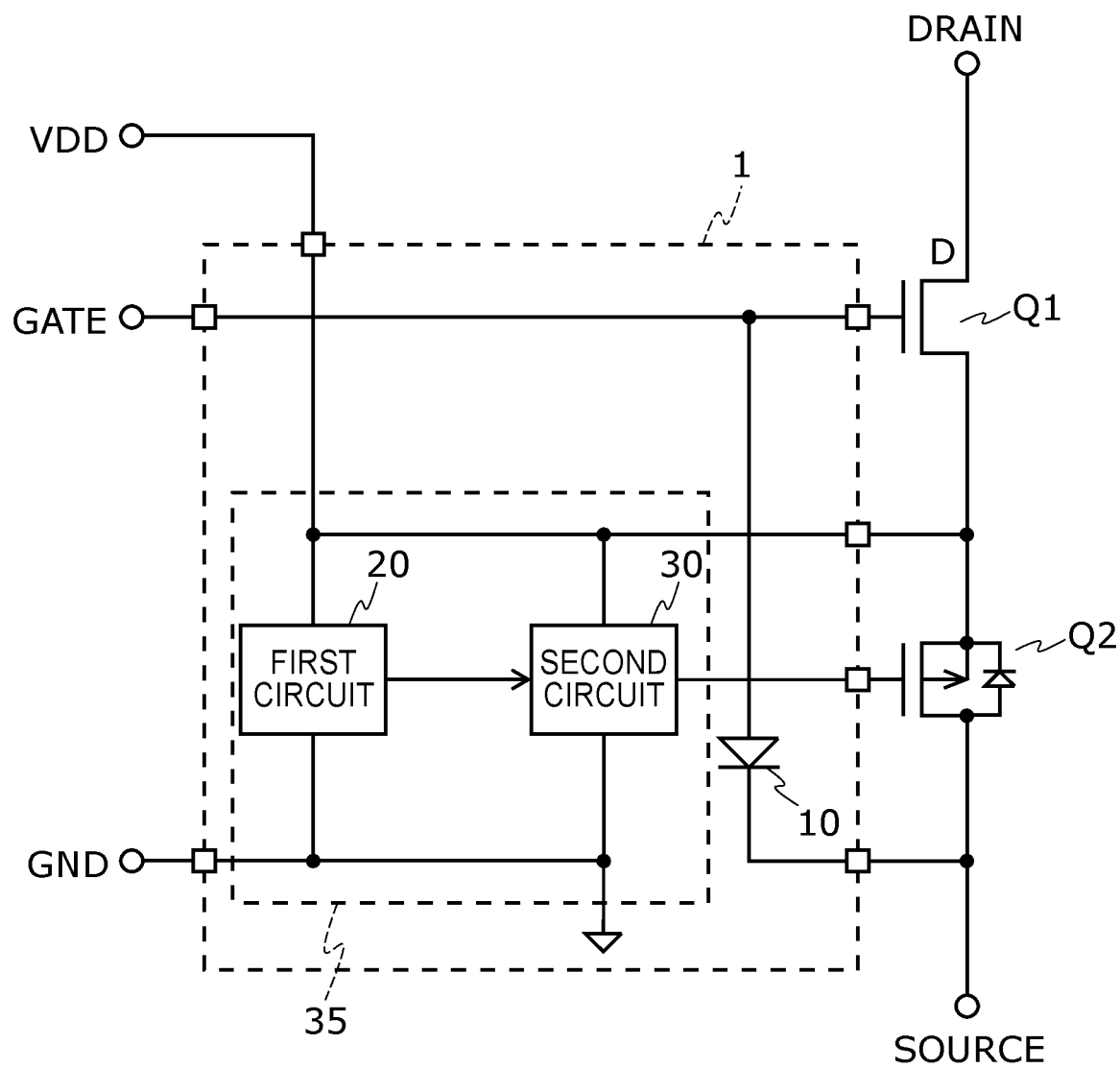
FIG. 1 is a circuit diagram showing an example of a semiconductor device according to an embodiment.

FIG. 1 is a circuit diagram showing an example of the semiconductor device according to the embodiment. A semiconductor device 1 is a circuit for normally-off driving a normally-on type first transistor Q1.

The first transistor Q1 is a power device using, for example, GaN, and is an FET of normally-on operation.

A second transistor Q2 is a p-type MOSFET connected in series sharing a source with the first transistor Q1, and the first transistor Q1 performs a normally-off operation due to the characteristics of the second transistor Q2.

Hereinafter, the drains of the first transistor Q1 and the second transistor Q2 are defined as drain and source, respectively, of the transistors each performing the normally-off operation. The semiconductor device 1 controls the voltage applied to the source and the gate of each transistor, thereby solving various problems in normally-off operation of the first transistor Q1.

When performing a normally-off operation via the semiconductor device 1, the first transistor Q1 is driven according to the voltage applied to the gate, and outputs a drain current from a source terminal SOURCE on the basis of a potential difference between a drain terminal DRAIN and the source terminal SOURCE. For example, an external load is connected to the drain terminal DRAIN, i.e., the drain side of the first transistor Q1, and the first transistor Q1 operates as a circuit that switches the load on the basis of the voltage applied to the gate.

The semiconductor device 1 is a circuit that controls voltages of the gate of the first transistor Q1, the gate of the second transistor Q2, and the drain of the second transistor Q2, and is connected with a power supply voltage terminal VDD, a gate voltage application terminal GATE, and a ground terminal GND. The semiconductor device 1 includes a first diode 10, a first circuit 20, and a second circuit 30. The gate voltage application terminal GATE is connected with the gate of the first transistor Q1.

The power supply voltage terminal VDD is connected to a node shared by the source of the first transistor Q1 and the source of the second transistor Q2 via the semiconductor device 1, and applies the power supply voltage to the semiconductor device 1. The ground terminal GND sets the ground potential of the semiconductor device 1. In the figure, connection with the ground point is made in the semiconductor device 1, but the present invention is not limited to this configuration, and connection with the ground may be made outside the semiconductor device 1. The ground terminal GND is not necessarily actually grounded, and may be connected to a potential of 0 V, or may be connected to a predetermined ground potential in the device. It should be understood that the ground terminal GND in the following description can all be interpreted in the same manner.

The first diode 10 is a protection circuit for the first transistor Q1 and the second transistor Q2. The first diode 10 has the anode connected with the gate of the first transistor Q1 and the cathode connected with the drain of the second transistor Q2.

The first circuit 20 is a circuit that detects the voltage of the power supply voltage. The first circuit 20 is connected between the power supply voltage terminal VDD and the ground terminal GND. The first circuit 20 compares the state of the power supply voltage, more specifically, the power supply voltage with the threshold voltage of the first transistor Q1, detects the voltage difference, and outputs it to the second circuit 30.

The second circuit 30 is a low-standby-power circuit and a circuit that outputs a voltage to drive the second transistor Q2 for an appropriate operation. The second circuit 30 is connected to the power supply voltage terminal VDD, the ground voltage GND, the first circuit 20, and the gate of the second transistor Q2. The second circuit 30 is a circuit that appropriately drives the second transistor Q2 when receiving a signal detecting the voltage state from the first circuit 20. Note that, the first circuitry 20 and the second circuitry 30 may be combined to form circuitry 35. And the circuitry 35 does not require an externally input signal.

When the power supply voltage rises, the first circuit 20 detects that the voltage has become higher than the absolute value of the threshold voltage of the first transistor Q1, i.e., the first transistor Q1 has turned off. The first circuit 20 outputs this voltage fluctuation to the second circuit 30. Upon receiving this signal, the second circuit 30 applies, to the gate of the second transistor Q2, a drive voltage that turns on the second transistor Q2 after the first transistor Q1 is turned off.

On the other hand, when the power supply voltage drops, the first circuit 20 outputs to the second circuit 30 that the power supply voltage is higher than the absolute value of the threshold voltage of the first transistor Q1, i.e., the voltage has dropped in a state where the first transistor Q1 is turned off. Upon receiving this signal, the second circuit 30 applies, to the gate of the second transistor Q2, a drive voltage that turns off the second transistor Q2 before the first transistor Q1 is turned on.

By using the first circuit 20 and the second circuit 30, even when the voltage applied to the power supply voltage terminal rises or drops at a high slew rate, it is possible to prevent the second transistor Q2 from being turned on in a state where the first transistor Q1 is turned on. Even in a state of voltage fluctuation in which the power supply voltage oscillates near the threshold voltage of the first transistor Q1, it is similarly possible to avoid a state in which both the first transistor Q1 and the second transistor Q2 are turned on. In this way, the circuitry 35 that causes the first transistor to operate normally-off can be configured by a passive circuit without an input of the external signal. In the embodiment, the circuitry 35 corresponds to the first circuit 20 and the second circuit 30.

Some specific implementation examples of the semiconductor device 1 will be described below.

Implementation Example 1

Figure 2:
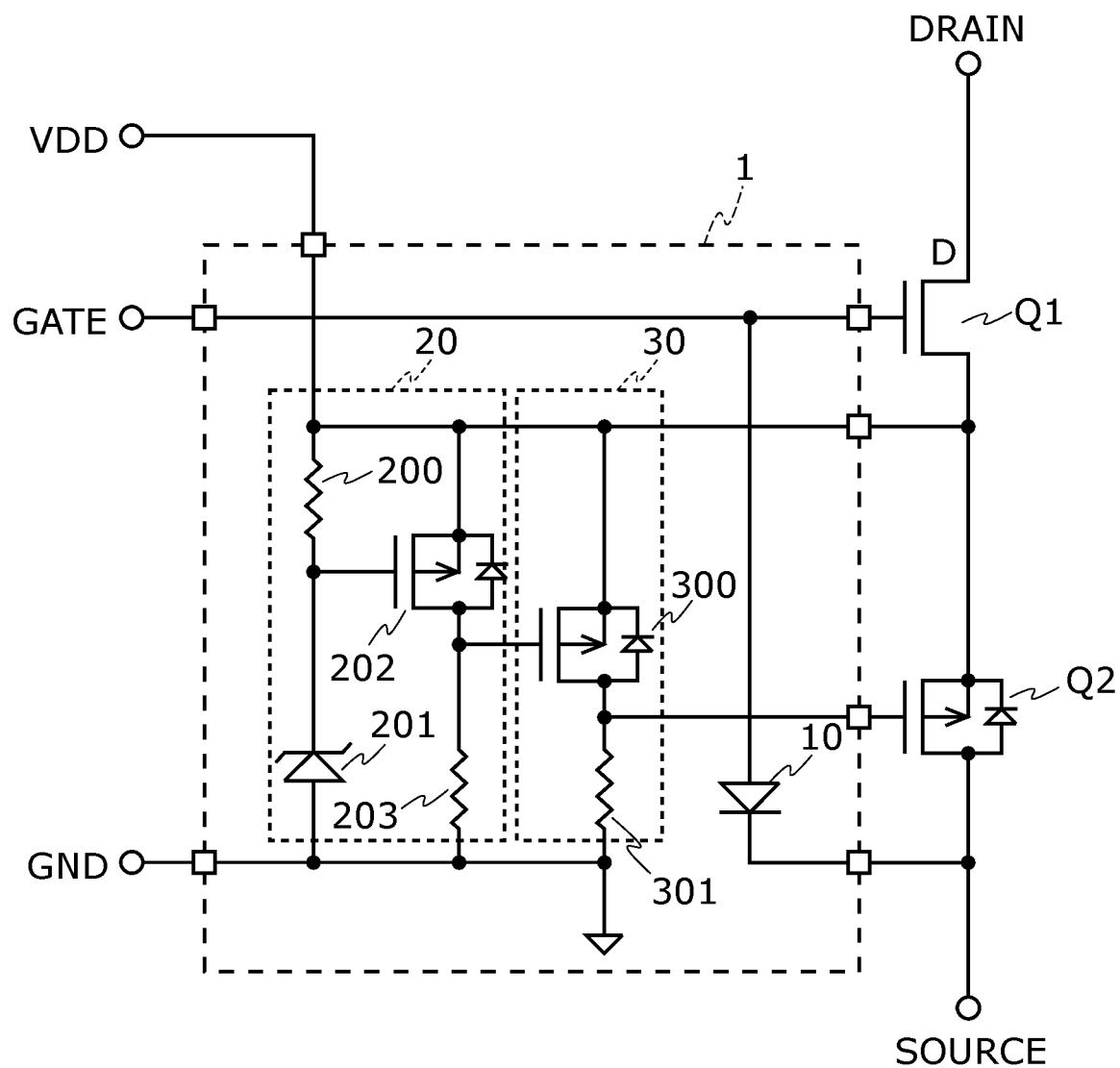
FIG. 2 is a circuit diagram showing an implementation example of the semiconductor device according to the embodiment.

FIG. 2 is a circuit diagram showing the semiconductor device 1 according to an implementation example. The semiconductor device 1 includes a first resistor 200, a second diode 201, a third transistor 202, a second resistor 203, a fourth transistor 300, and a third resistor 301. As shown in the figure, by way of example, the first resistor 200, the second diode 201, the third transistor 202, and the second resistor 203 are provided as a part of the first circuit 20, and the fourth transistor 300 and the third resistor 301 are provided as a part of the second circuit 30.

The first resistor 200 is connected between the power supply voltage terminal VDD and the second diode 201.

In the second diode 201, the anode is connected with the ground terminal GND, and the cathode is connected with the power supply voltage terminal VDD via the first resistor 200. The second diode 201 is a Zener diode having a Zener voltage equal to or higher than the absolute value of the threshold voltage of the first transistor Q1 and lower than a steady value Vdd (e.g., the maximum value of the voltage applied to the power supply, and is about 15 V) of the power supply voltage.

In a case where a voltage equal to or higher than the Zener voltage of the second diode 201 is applied to the power supply terminal VDD, the first resistor 200 and the second diode 201 operate as a circuit that outputs a constant voltage (Zener voltage) from the connection node and, in a case otherwise, operate as a circuit that outputs a voltage based on the voltage applied to the power supply voltage terminal VDD.

The third transistor 202 is, for example, a p-type MOSFET, where the source is connected with the power supply voltage terminal VDD, the drain is connected with the ground terminal GND via the second resistor 203, and the gate is connected with the cathode of the second diode 201. The third transistor 202 is a transistor having the threshold voltage of a negative value and its absolute value is lower than (steady value Vdd of the power supply voltage)— (Zener voltage of the second diode 201).

The second resistor 203 is connected between the drain of the third transistor 202 and the ground terminal GND. By the current flowing through the third transistor 202, the potential of the drain of the third transistor is defined by the resistance value of the second resistor 203. For example, the first circuit 20 outputs the voltage of the drain of the third transistor 202.

The fourth transistor 300 is, for example, a p-type MOSFET, where the source is connected with the power supply voltage terminal VDD, the drain is connected with the ground terminal GND via the third resistor 301, and the gate is connected with the drain of the third transistor 202. The fourth transistor 300 is a transistor having the threshold voltage of a negative value and its absolute value is lower than the steady value Vdd.

The third resistor 301 is provided between the drain of the fourth transistor 300 and the ground terminal GND.

With this configuration, the first circuit 20 outputs a voltage based on the voltage applied to the power supply voltage terminal VDD, and the second circuit 30 outputs, to the gate of the second transistor Q2, a voltage according to the voltage output from the first circuit 20.

The operation of the first transistor Q1 and the second transistor Q2 when the voltage applied to the power supply voltage terminal VDD fluctuates will be described now.

First, a case where the voltage applied to the power supply voltage terminal VDD rises from 0 to the voltage Vdd will be described. When the voltage applied to the power supply voltage terminal VDD exceeds the threshold voltage of the first transistor Q1, the first transistor Q1 is turned off. At this timing, since the voltage applied to the power supply voltage terminal VDD has not exceeded the Zener voltage of the second diode 201, no current flows through the first resistor 200, the gate-source voltage of the third transistor 202 becomes 0, and the third transistor 202 continues to be in an off state. Since no current flows through the second resistor 203, the fourth transistor 300 is turned on, this drain current and the voltage by the third resistor 301 are applied to the gate of the second transistor Q2, and the second transistor Q2 continues to be in an off state.

When the voltage applied to the power supply voltage terminal VDD becomes higher and exceeds the Zener voltage of the second diode 201, the gate-source voltage of the third transistor 202 becomes the voltage between the terminals of the first resistor 200. In this state, if the voltage applied to the power supply voltage terminal VDD is lower than the sum of the Zener voltage and the absolute value of the threshold voltage of the third transistor 202, the state of the third transistor 202 and the state of the fourth transistor 300 do not change. That is, the third transistor 202 is turned off, the fourth transistor 300 is turned on, and the second transistor Q2 is turned off.

When the voltage applied to the power supply voltage terminal VDD becomes higher and exceeds the sum of the Zener voltage and the absolute value of the threshold voltage of the third transistor 202, the gate-source voltage of the third transistor 202 falls below the threshold voltage of the third transistor 202, and the third transistor 202 is turned on. When the third transistor 202 is turned on, a drain current of the third transistor 202 and a voltage by the second resistor 203 are applied to the gate of the fourth transistor 300.

In this state, the voltage applied to the gate of the fourth transistor 300 rises as the voltage applied to the power supply voltage terminal VDD increases, thereby causing the fourth transistor 300 to be gradually turned off. When the voltage applied to the power supply voltage terminal VDD exceeds the absolute value of the threshold value of the fourth transistor 300, the fourth transistor 300 is turned off. That is, the voltage applied to the gate of the second transistor Q2 becomes smaller as the voltage applied to the power supply voltage terminal VDD increases, and the second transistor Q2 is turned on at a timing that falls below the threshold voltage of the second transistor Q2.

Summarizing the above situation, for example, when the voltage applied to the power supply voltage terminal VDD rises from 0 to the voltage Vdd, the first transistor Q1 first transitions from on to off, the states of the third transistor 202 and the fourth transistor 300 then transition, and the second transistor Q2 transitions from off to on. Thus, a time margin occurs from when the first transistor Q1 is turned off to when the second transistor Q2 is turned on, and it is possible to achieve a configuration in which these two transistors are not turned on at the same time.

Next, a case where the voltage applied to the power supply voltage terminal VDD falls from the voltage Vdd to 0 will be described.

When the voltage applied to the power supply voltage terminal VDD drops until Vdd—(Zener voltage of the second diode 201), i.e., the voltage between the terminals of the first resistor 200 falls below the threshold voltage of the third transistor 202, the third transistor 202 transitions from the on state to the off state.

As a result, when the fourth transistor 300 transits to the on state and the voltage formed by the drain current of the fourth transistor 300 and the third resistor 301 exceeds the threshold voltage of the second transistor Q2, the second transistor Q2 transits to the off state.

Thereafter, when the voltage applied to the power supply voltage terminal VDD further drops and falls below the threshold voltage of the first transistor Q1, the first transistor Q1 is turned on.

Summarizing the above situation, for example, when the voltage applied to the power supply voltage terminal VDD drops from the voltage Vdd to 0, the states of the third transistor 202 and the fourth transistor 300 first transition, the second transistor Q2 transitions from on to off, and the first transistor Q1 transitions to the on state. Thus, a time margin occurs from when the second transistor Q2 is turned off to when the first transistor Q1 is turned on, and it is possible to achieve a configuration in which these two transistors are not turned on at the same time.

The turn-on and turn-off drive forces of the second transistor Q2 at the time of rise and fall of the voltage applied to the power supply voltage terminal VDD are determined by the value of the third resistor 301 and the on-resistance value of the fourth transistor 300, respectively. By setting the resistance value of the third resistor 301 to a value larger than the on-resistance of the fourth transistor 300, the turn-off of the second transistor Q2 can be made faster than the turn-off.

Figure 3:
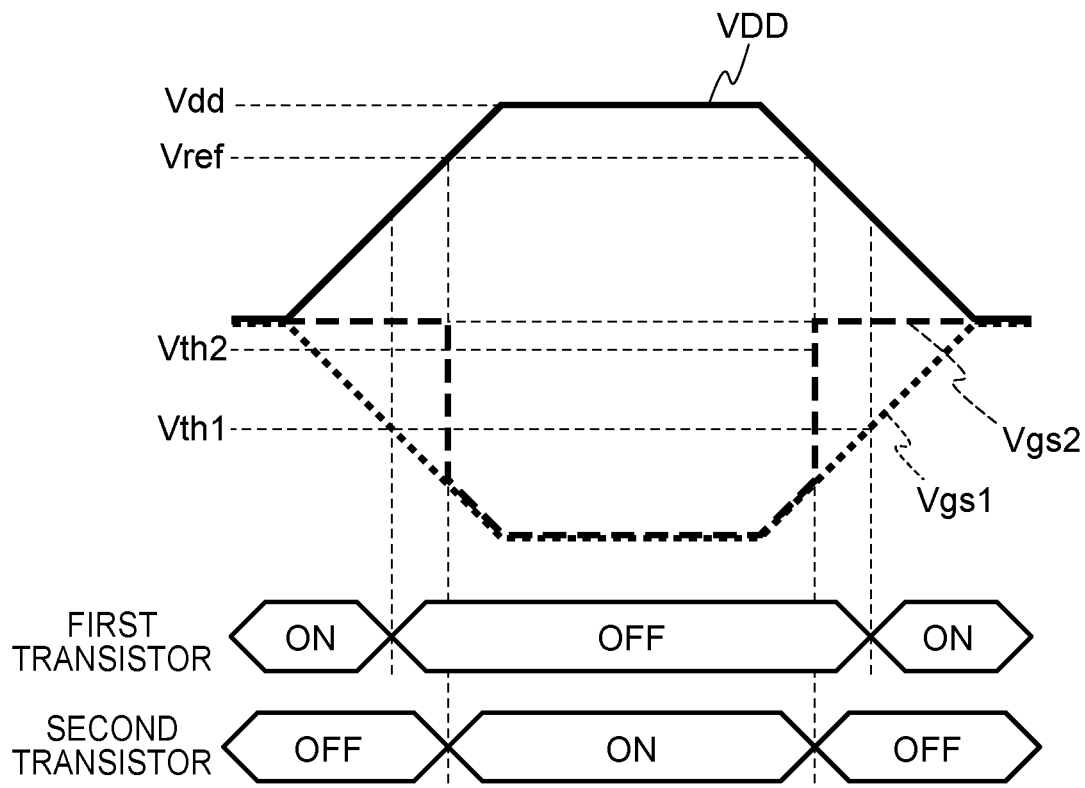
FIG. 3 is a view showing an on/off state of a transistor according to the embodiment.

FIG. 3 is a view showing voltages of the components in the circuit of FIG. 2. The solid line represents the voltage applied to the power supply voltage terminal VDD, the dotted line represents a gate-source voltage Vgs1 of the first transistor Q1, and the broken line represents a gate-source voltage Vgs2 of the second transistor Q2.

Further, Vth1 is the threshold voltage of the first transistor Q1, and Vth2 is the threshold voltage of the second transistor Q2. Vref is a Zener voltage of the second diode 201, which is the voltage to be detected in the first circuit 20.

As for ON and OFF in the lower part, the upper stage indicates the on/off state of the first transistor Q1, and the lower stage indicates the on/off state of the second transistor Q2.

As shown in FIG. 3, regardless of whether the voltage applied to the power supply voltage terminal VDD rises or drops, the timing at which the first transistor Q1 and the second transistor Q2 are turned on or off transitions through a state in which both transistors are turned off. Therefore, these two transistors are not turned on at the same timing.

In the circuit configuration of FIG. 2, since the voltage Vdd is applied to the gate of the second transistor Q2 in a steady state where the first transistor Q1 is turned off, the second transistor Q2 can be driven with a low on-resistance.

As described above, even in a case where the slew rate of the voltage applied to the power supply voltage terminal VDD is high or a case where the voltage applied to the power supply voltage terminal VDD oscillates, it is possible to prevent the first transistor Q1 and the second transistor Q2 from being turned on at the same time.

In a steady state after the power supply voltage has risen, the fourth transistor 300 is in the off state, and hence no standby current flows, and it becomes possible to achieve both a drive force difference for preventing the first transistor Q1 and the second transistor Q2 from being turned on at the same time and a low power consumption. As a result, the standby power of the entire circuit is defined by the current flowing through the first resistor 200 and the second resistor 203, and by setting these two resistance values to large values, it becomes possible to achieve a low power consumption as a whole. Setting the resistance value to a large value may be setting to a resistance value of, for example, several tens of kΩ, and in this case, the power consumption becomes about ~1 mA at a power supply voltage of about 15 V, and it is possible to achieve the low power consumption as a transistor driving circuit.

Implementation Example 2

Figure 4:
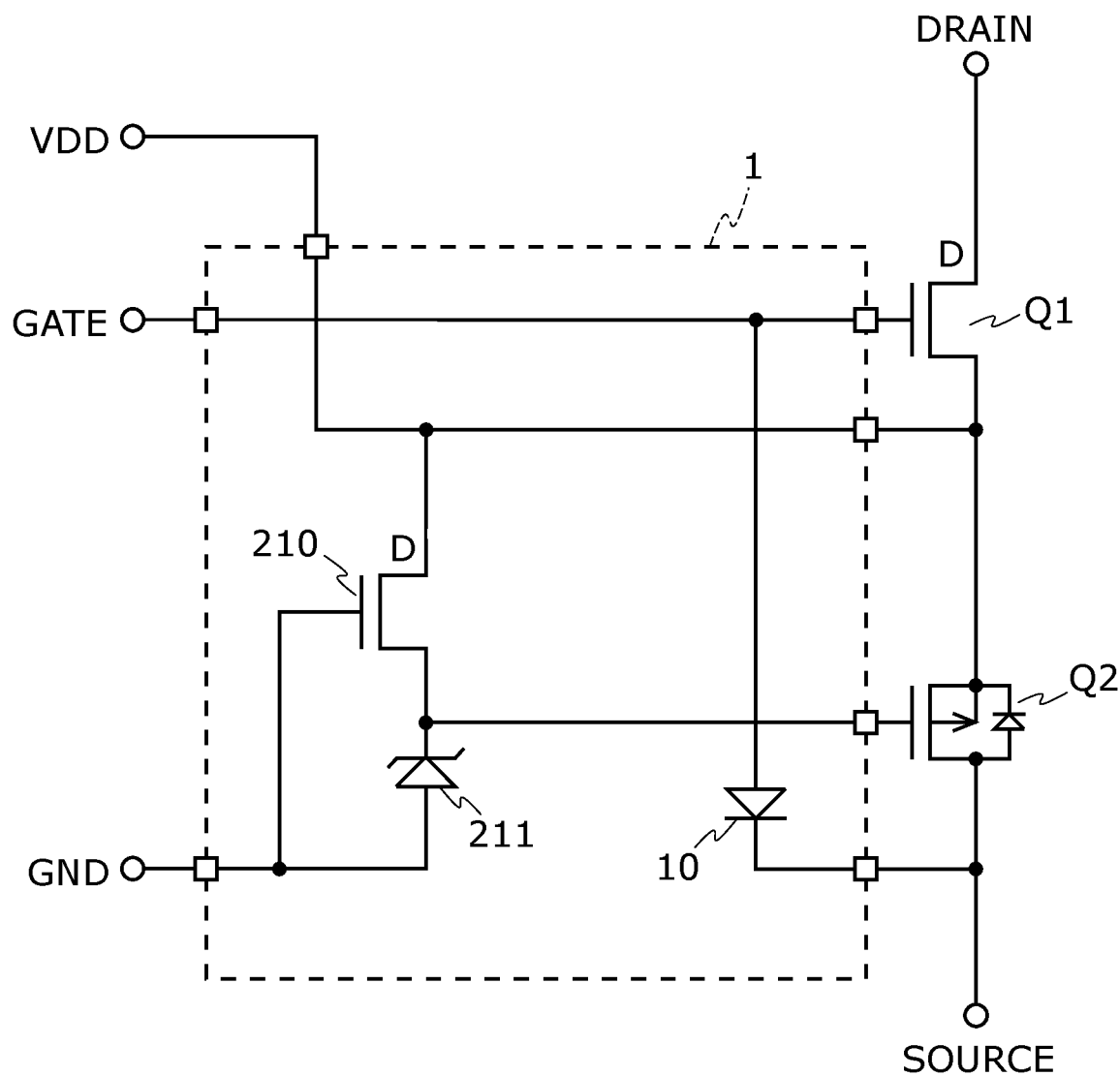
FIG. 4 is a circuit diagram showing an implementation example of the semiconductor device according to the embodiment.

FIG. 4 is a circuit diagram showing the configuration of the semiconductor device 1 according to the implementation example 2 different from the implementation example 1 described above. The semiconductor device 1 includes a fifth transistor 210 and a third diode 211. The fifth transistor 210 and the third diode 211 form the first circuit 20 and the second circuit 30 in FIG. 1.

The fifth transistor 210 is a transistor that performs a normally-on operation, for example, where the drain is connected with the power supply voltage terminal VDD, the source is connected with the ground terminal GND via the third diode 211, and the gate is connected with the ground terminal GND. This fifth transistor has a characteristic, for example, that the threshold voltage is negative and its absolute value is equal to or greater than the absolute value of the threshold voltage of the first transistor Q1 and lower than the voltage Vdd.

The third diode 211 is, for example, a Zener diode, where the anode is connected with the ground terminal GND, and the cathode is connected with the source of the fifth transistor 210. The third diode 211 has a Zener voltage equal to or greater than the absolute value of the threshold voltage of the first transistor Q1 and lower than the voltage Vdd— (absolute value of the threshold voltage of the second transistor Q2).

The connection node of the source of the fifth transistor 210 and the cathode of the third diode 211 is connected to the gate of the second transistor Q2, and the voltage of the node becomes the drive voltage of the second transistor Q2.

The operation of the first transistor Q1 and the second transistor Q2 when the voltage applied to the power supply voltage terminal VDD fluctuates will be described now.

First, a case where the voltage applied to the power supply voltage terminal VDD rises from 0 to the voltage Vdd will be described. When the voltage applied to the power supply voltage terminal VDD exceeds the threshold voltage of the first transistor Q1, the first transistor Q1 is turned off. At this timing, since the fifth transistor 210 is on, the second transistor Q2 maintains the off state.

When the voltage applied to the power supply voltage terminal VDD further rises and exceeds the absolute value of the threshold voltage of the fifth transistor 210 and the Zener voltage of the third diode 211, the fifth transistor 210 is turned off and the gate voltage of the second transistor Q2 is raised to the Zener voltage (or a voltage equal to or lower than the Zener voltage).

When the voltage applied to the power supply voltage terminal VDD further rises and the gate-source voltage of the second transistor Q2 falls below the threshold voltage, the second transistor Q2 is turned on.

Summarizing the above situation, for example, when the voltage applied to the power supply voltage terminal VDD rises from 0 to the voltage Vdd, the first transistor Q1 first transitions from on to off, the gate voltage of the second transistor Q2 becomes the Zener voltage (or a voltage equal to or lower than the Zener voltage) of the third diode 211 by the fifth transistor 210 and the third diode 211, and subsequently the second transistor Q2 transitions from off to on. Thus, a time margin occurs from when the first transistor Q1 is turned off to when the second transistor Q2 is turned on, and it is possible to achieve a configuration in which these two transistors are not turned on at the same time.

Next, a case where the voltage applied to the power supply voltage terminal VDD falls from the voltage Vdd to 0 will be described.

First, when the voltage applied to the power supply voltage terminal VDD falls below the threshold voltage of the fifth transistor 210, the fifth transistor 210 is turned on. When the fifth transistor 210 is turned on, the potential of the gate of the second transistor Q2 exceeds the threshold voltage by this drain current, and the second transistor Q2 is turned off.

Thereafter, when the voltage applied to the power supply voltage terminal VDD exceeds the threshold voltage of the first transistor Q1, the first transistor Q1 is turned on.

Summarizing the above situation, for example, when the voltage applied to the power supply voltage terminal VDD drops from the voltage Vdd to 0, the fifth transistor 210 is first turned on, and the second transistor Q2 transitions from on to off accordingly. After that, the first transistor Q1 transitions from off to on. Thus, a time margin occurs from when the first transistor Q1 is turned off to when the second transistor Q2 is turned on, and it is possible to achieve a configuration in which these two transistors are not turned on at the same time.

The turn-on and turn-off drive forces of the second transistor Q2 at the time of rise and fall of the voltage applied to the power supply voltage terminal VDD are determined by the on-resistance value of the fifth transistor 210 and the dynamic resistance of the third diode 211, respectively. By making the dynamic resistance of the third diode 211 have a value larger than the on-resistance of the fifth transistor 210, the turn-off of the second transistor Q2 can be made faster than the turn-off.

Figure 5:
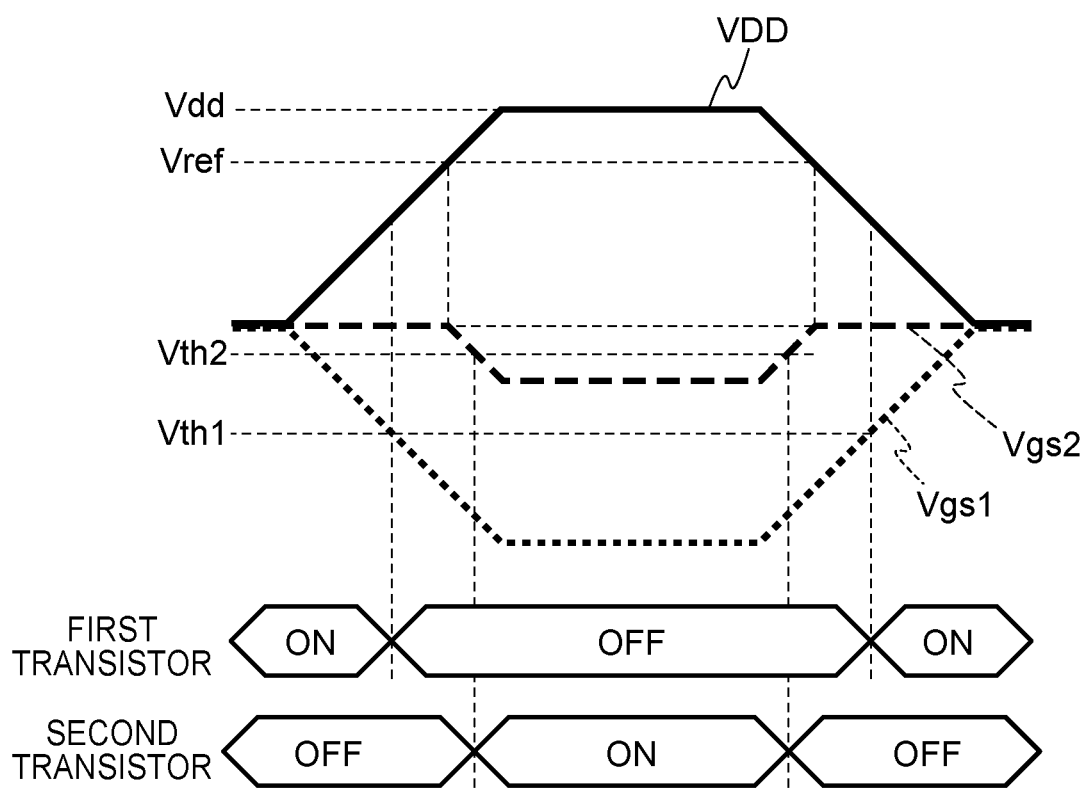
FIG. 5 is a view showing an on/off state of a transistor according to the embodiment.

FIG. 5 is a view showing voltages of the components in the circuit of FIG. 4. The solid line represents the voltage applied to the power supply voltage terminal VDD, the dotted line represents a gate-source voltage Vgs1 of the first transistor Q1, and the broken line represents a gate-source voltage Vgs2 of the second transistor Q2.

Further, Vth1 is the threshold voltage of the first transistor Q1, and Vth2 is the threshold voltage of the second transistor Q2. Vref is a Zener voltage of the third diode 211.

As for ON and OFF in the lower part, the upper stage indicates the on/off state of the first transistor Q1, and the lower stage indicates the on/off state of the second transistor Q2.

As shown in FIG. 5, regardless of whether the voltage applied to the power supply voltage terminal VDD rises or drops, the timing at which the first transistor Q1 and the second transistor Q2 are turned on or off transitions through a state in which both transistors are turned off. Therefore, these two transistors are not turned on at the same timing.

In the steady state where the first transistor Q1 is turned off, the voltage of the difference between the voltage of the power supply voltage terminal VDD and the Zener voltage of the third diode 211 is applied to the gate of the second transistor Q2, and hence the on-resistance of the second transistor Q2 becomes higher in the circuit configuration of FIG. 4 compared with the circuit configuration of FIG. 2.

In a steady state after the VDD voltage has risen, the first transistor Q1 is in the off state, and hence no standby current flows, and it becomes possible to achieve both a drive force difference for preventing being turned on at the same time and a low power consumption. In comparison with the implementation example 1, in the implementation example 2, the on-resistance of the second transistor Q2 tends to become large because the applied voltage for turning on the second transistor Q2 becomes low, but the implementation example 2 has a feature that can reduce the number of circuit components and can achieve the low power consumption, compared with the implementation example 1.

As described above, even in a case where the slew rate of the voltage applied to the power supply voltage terminal VDD is high or a case where the voltage applied to the power supply voltage terminal VDD oscillates, it is possible to prevent the first transistor Q1 and the second transistor Q2 from being turned on at the same time.

In a steady state after the power supply voltage has risen, the fifth transistor 210 is in the off state, and hence no standby current flows, and it becomes possible to achieve both a drive force difference for preventing the first transistor Q1 and the second transistor Q2 from being turned on at the same time and a low power consumption. In the configuration shown in FIG. 4, the applied voltage for turning on the second transistor Q2 becomes lower than that in the configuration shown in FIG. 2, and hence the on-resistance of the second transistor Q2 tends to become large, but the configuration shown in FIG. 4 can reduce the number of circuit components and can achieve the low power consumption, compared with the implementation example 1.

Implementation Example 3

Figure 6:
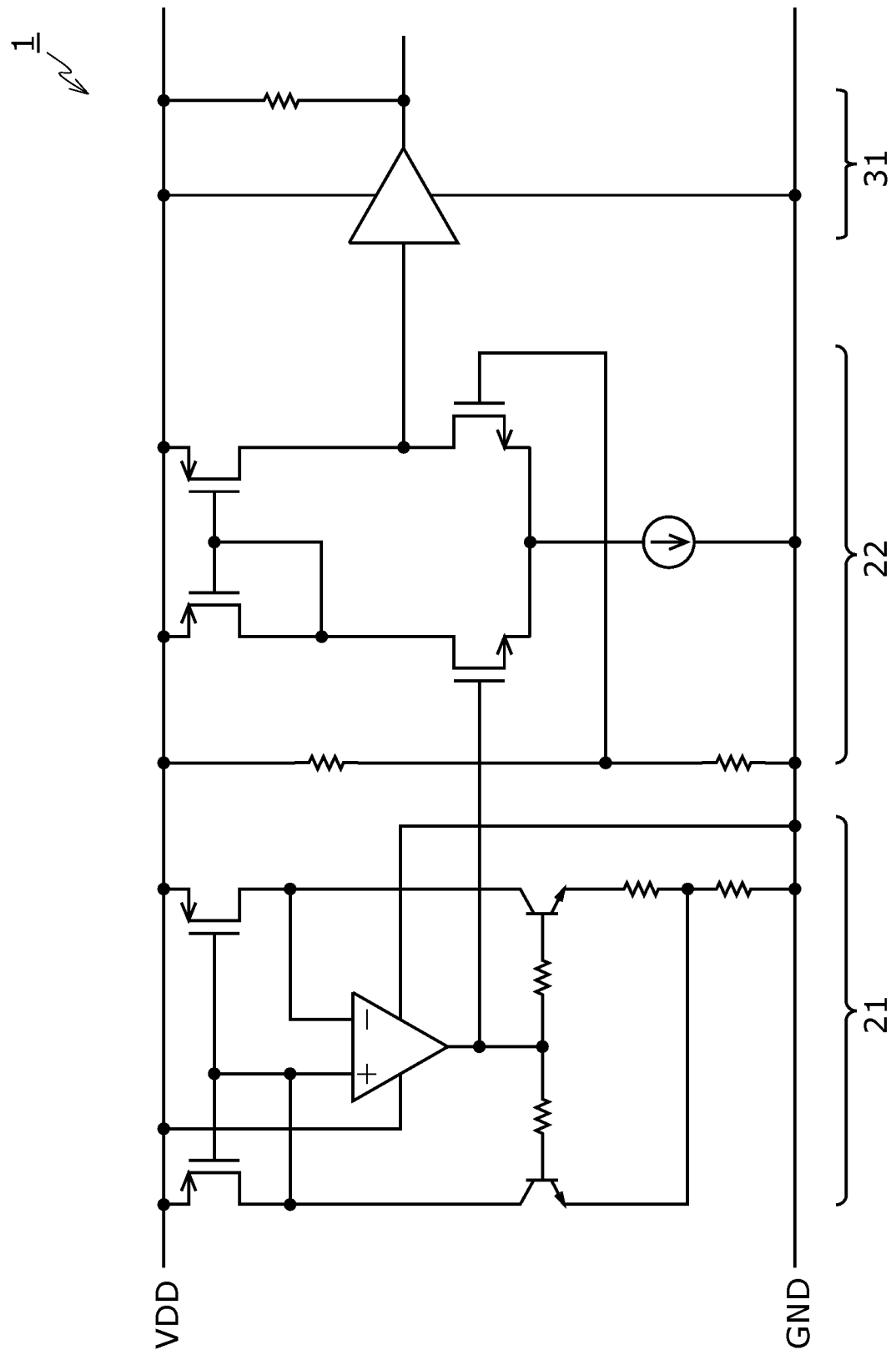
FIG. 6 is a circuit diagram showing an implementation example of the semiconductor device according to the embodiment.

FIG. 6 is a circuit diagram showing the configuration of the semiconductor device 1 according to the implementation example 3. The first circuit 20 includes a reference voltage generation circuit 21 and a voltage comparison circuit 22. The second circuit 30 includes an output buffer 31.

The reference voltage generation circuit 21 generates a reference voltage Vref. While an example is shown in FIG. 6, the present invention is not limited to this example, and a circuit is only required to be configured as a circuit capable of outputting the reference voltage Vref.

The voltage comparison circuit 22 compares the voltage generated by the reference voltage generation circuit 21 with the voltage applied to the power supply voltage terminal VDD. The voltage comparison circuit 22 is formed by inputting, to the input of a general comparator, for example, the output of the reference voltage generation circuit 21 and the voltage between a plurality of resistors that proportionally divide between the power supply voltage terminal VDD and the ground terminal GND at a predetermined ratio. The voltage comparison circuit 22 detects a voltage larger than the absolute value of the threshold voltage of the first transistor Q1 and outputs the detected voltage to the output buffer 31.

The output buffer 31 controls the output of the voltage comparison circuit 22 and applies it to the gate of the second transistor Q2.

Figure 7:
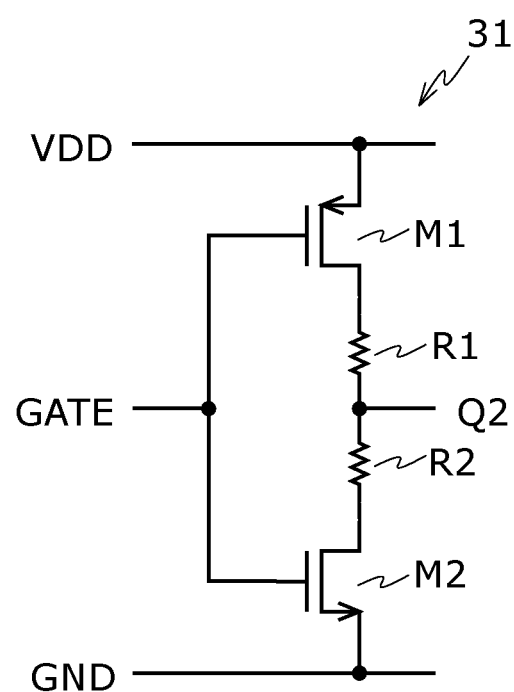
FIG. 7 is a circuit diagram showing an implementation example of the semiconductor device according to the embodiment.

FIG. 7 is a circuit showing the output buffer 31 according to an implementation example. The output buffer 31 includes, for example, a sixth transistor M1, a seventh transistor M2, a fourth resistor R1, and a fifth resistor R2.

The sixth transistor M1 is a p-type MOSFET, where the source is connected with the power supply voltage terminal VDD and the gate is connected with the output of the voltage comparison circuit 22.

The seventh transistor M2 is an n-type MOSFET, where the source is connected with the ground terminal GND and the gate is connected with the output of the voltage comparison circuit 22.

The fourth resistor R1 is connected between the drain of the sixth transistor M1 and the output terminal.

The fifth resistor R2 is connected between the drain of the seventh transistor M2 and the output terminal.

The fifth resistor R2 has a resistance value larger than the resistance value of the fourth resistor R1. By thus setting the resistance values of the fourth resistor R1 and the fifth resistor R2, the resistance value in the current path when the second transistor Q2 is turned on can be made larger than the resistance value in the current path when the second transistor Q2 is turned off. As a result, the turn-off drive force of the second transistor Q2 can be made higher than the turn-on drive force.

This resistor configuration can prevent the first transistor Q1 and the second transistor Q2 from being turned on at the same time even in a case where the slew rate of the voltage applied to the power supply voltage terminal VDD is high or in a case where the voltage oscillates.

Figure 8:
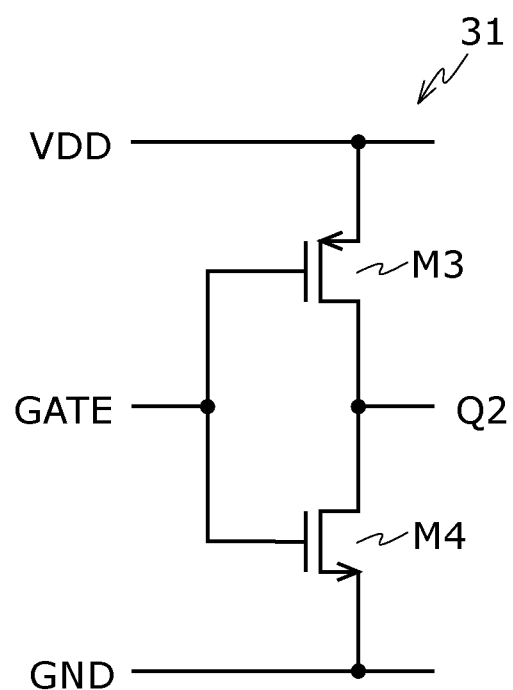
FIG. 8 is a circuit diagram showing an implementation example of the semiconductor device according to the embodiment.

FIG. 8 presents a circuit showing another implementation example of the output buffer 31. The output buffer 31 includes, for example, an eighth transistor M3 and a ninth transistor M4.

The eighth transistor M3 is a p-type MOSFET, where the source is connected with the power supply voltage terminal VDD and the gate is connected with the output of the voltage comparison circuit 22.

The ninth transistor M4 is an n-type MOSFET, where the source is connected with the ground terminal GND, the gate is connected with the output of the voltage comparison circuit 22, and the drain is connected with the drain of the eighth transistor M8.

As can be seen from the above, the eighth transistor M3 and the ninth transistor M4 form a complementary MOSFET (CMOS). In the present implementation example, as an example, the gate width of the eighth transistor M3 is formed larger than the gate width of the ninth transistor M4.

By forming such a CMOS, the on-resistance value in the path where the second transistor Q2 is turned on can be made larger than the on-resistance value in the path where the second transistor Q2 is turned off. As a result, the turn-off drive force of the second transistor Q2 can be made higher than the turn-on drive force.

This configuration can prevent the first transistor Q1 and the second transistor Q2 from being turned on at the same time even in a case where the slew rate of the voltage applied to the power supply voltage terminal VDD is high or in a case where the voltage oscillates.

Figure 9:
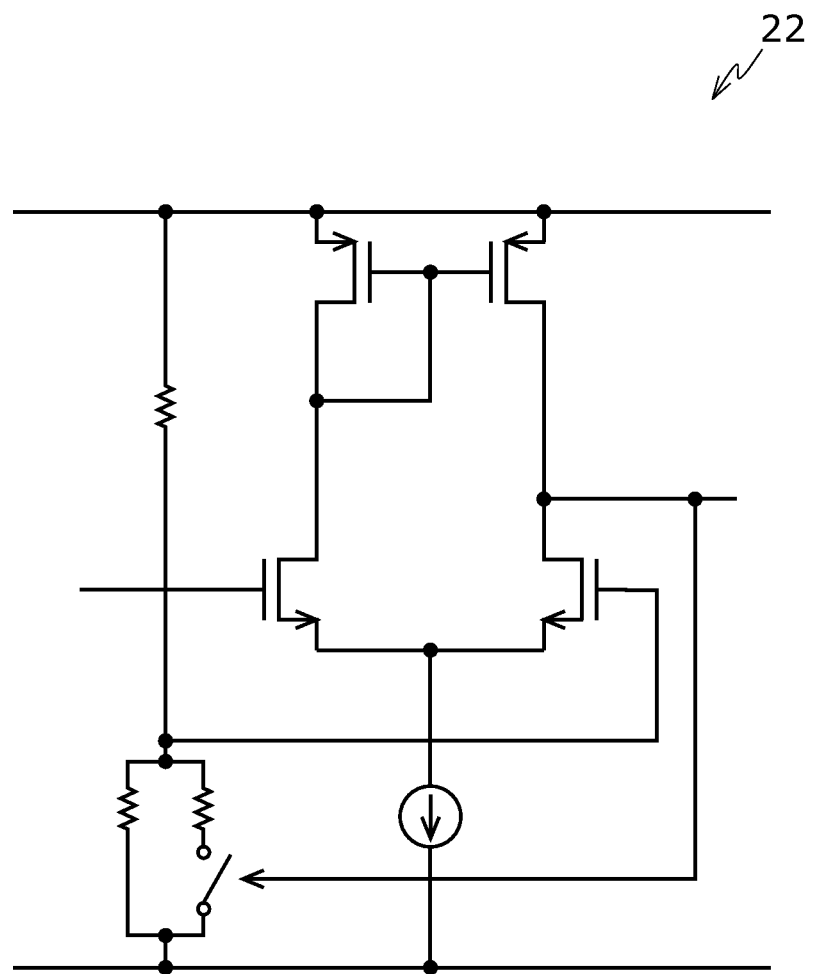
FIG. 9 is a circuit diagram showing an implementation example of the semiconductor device according to the embodiment.

FIG. 9 is a diagram showing another implementation example of the voltage comparison circuit 22. As shown in this figure, a hysteresis comparator may be used as the voltage comparison circuit.

Implementation Example 4

Figure 10:
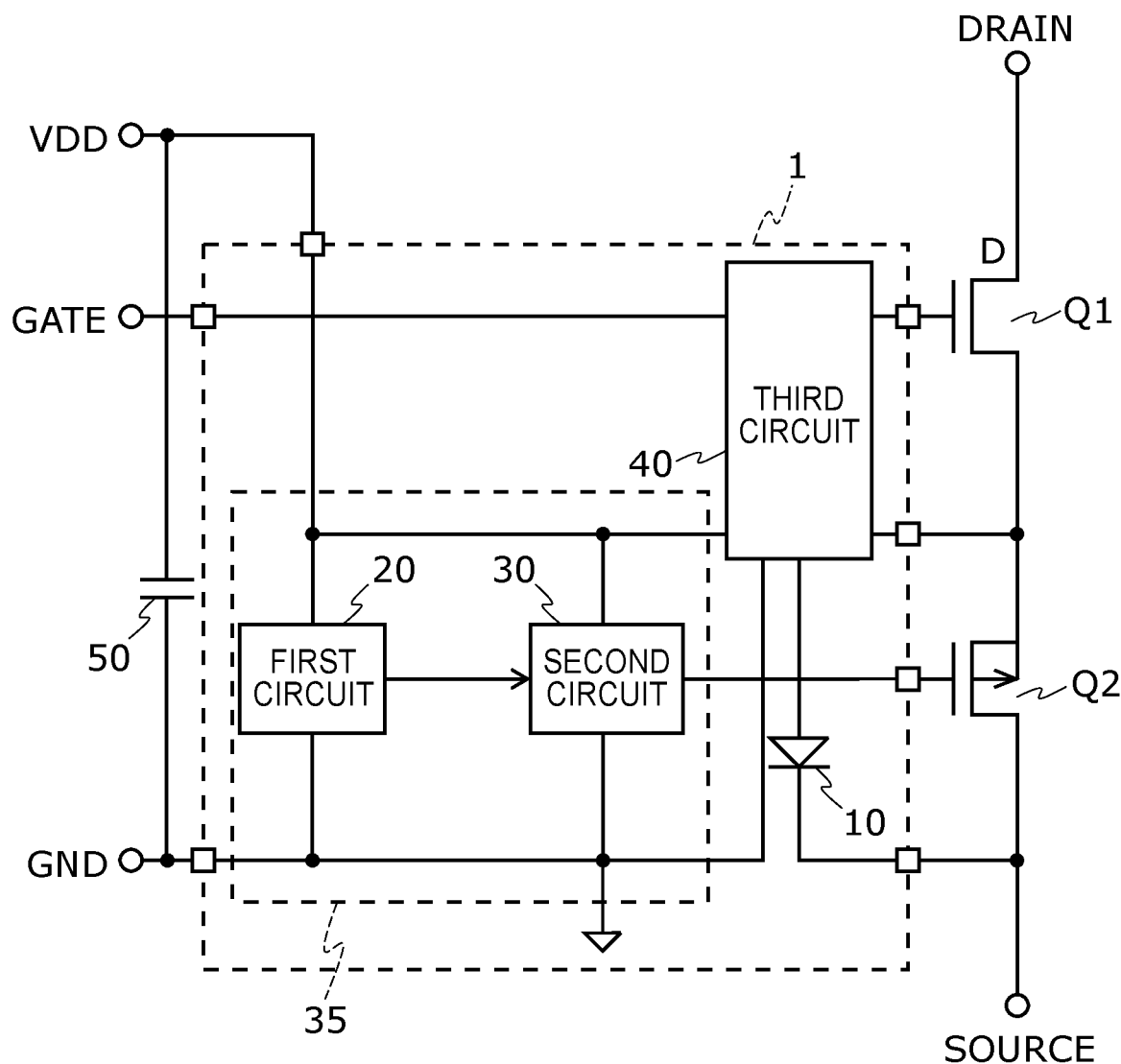
FIG. 10 is a circuit diagram showing an example of the semiconductor device according to the embodiment.

FIG. 10 is a circuit diagram showing the configuration of the semiconductor device 1 according to the implementation example 3. In addition to the first circuit 20 and the second circuit 30 of FIG. 1, the semiconductor device 1 further includes a third circuit 40.

The third circuit 40 is a circuit that, before the VDD power supply is started and when a voltage is applied between the drain terminal DRAIN and the source terminal SOURCE, achieves both prevention of a charge current to a capacitor 50 connected outside the semiconductor device 1 between the power supply voltage and the ground voltage and prevention of an overvoltage applied to the gate of the first transistor Q1.

When the capacitor 50 is charged, a current flows to each component of the semiconductor device 1 on the basis of the charged voltage. For example, this current is about to flow in the order of the drain terminal DRAIN, the first transistor Q1, the power supply voltage terminal VDD, the capacitor 50, the ground terminal GND, a body diode of the element that switches the first transistor Q1 in the third circuit 40, the first diode 10, and the source terminal SOURCE. The third circuit 40 prevents this current.

Figure 11:
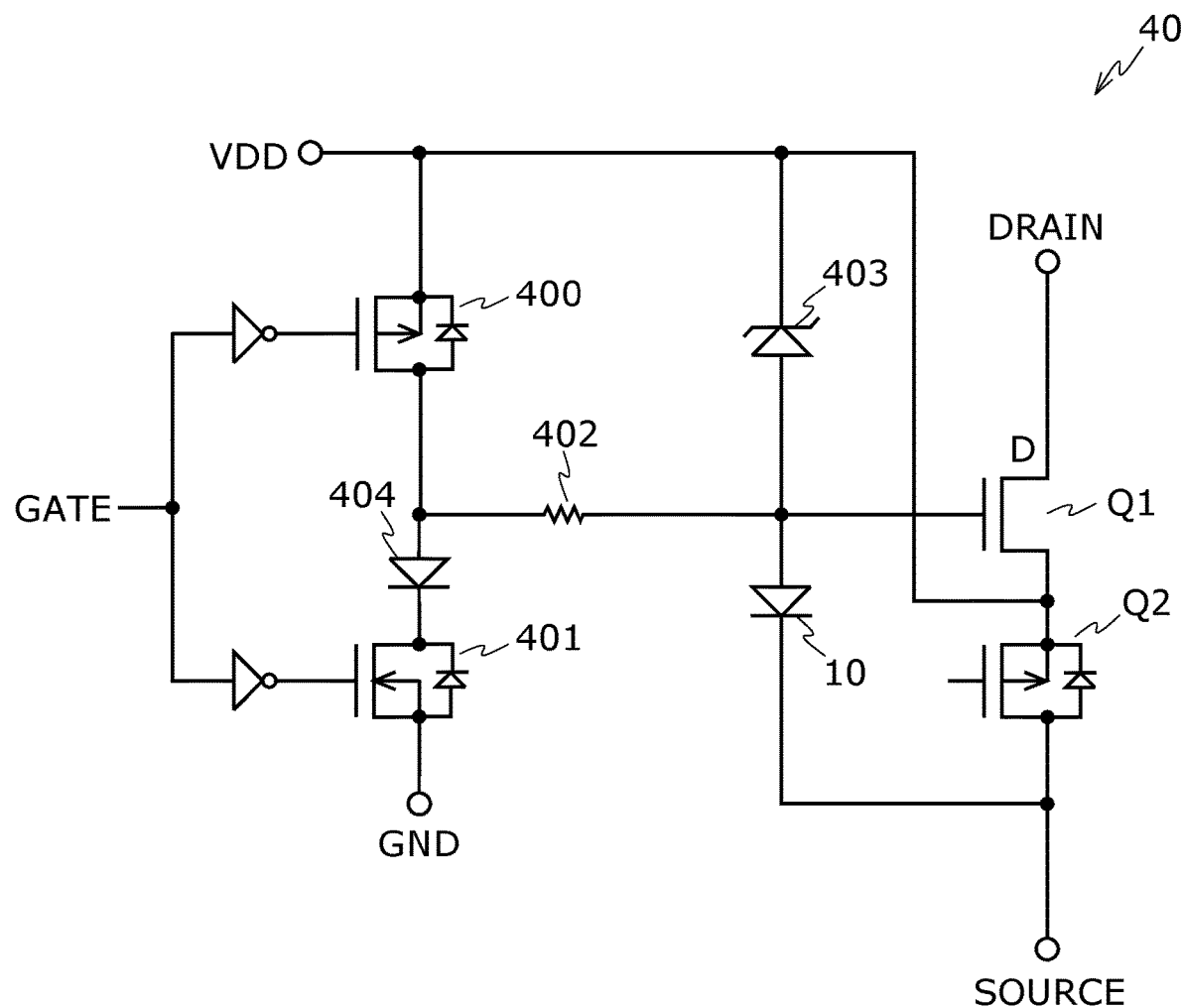
FIG. 11 is a circuit diagram showing an implementation example of the semiconductor device according to the embodiment.

FIG. 11 is a circuit diagram showing an implementation example of the third circuit 40. The third circuit 40 includes a first switch 400, a second switch 401, a sixth resistor 402, a fourth diode 403, and a fifth diode 404.

The first switch 400 is, for example, a p-type MOSFET, where the source is connected with the power supply voltage terminal VDD, the gate is connected to the inverter output, and the inverter input is connected to the gate voltage application terminal GATE.

The second switch 401 is, for example, an n-type MOSFET, where the source is connected with the ground terminal GND, the gate is connected to the inverter output, and the inverter input is connected to the gate voltage application terminal GATE. The sixth resistor 402 has one end connected with the drain of the first switch 400 and the other end connected with the gate of the first transistor Q1. The sixth resistor 402 operates as a gate resistor that controls the gate current of the first transistor Q1.

The fourth diode 403 has the anode connected with the anode of the first diode 10 and the gate of the first transistor Q1, and the cathode connected with the power supply voltage terminal VDD.

The fifth diode 404 has the anode connected with the drain of the first switch 400 and connected with the gate of the first transistor Q1 via the sixth resistor 402, and the cathode connected with the drain of the second switch 401.

According to this configuration, the current passing through the body diode of the second switch 401 for turning off the first transistor Q1 can be prevented by the fifth diode 404 connected between the second switch 401 and the first switch 400 and the sixth resistor 402. By the connection of the fifth diode 404, when the gate voltage of the first transistor Q1 becomes a voltage lower than the ground voltage GND, it becomes impossible to clamp due to the body diode of the second switch 401, but this can be prevented by connecting the fourth diode 403 between the gate of the first transistor Q1 and the power supply voltage terminal VDD.

As described above, according to the third circuit 40 according to the present implementation example, it is possible to achieve both prevention of the charge current to the capacitor 50 and prevention of the overvoltage of the gate voltage of the first transistor Q1.

Implementation Example 5

Figure 12:
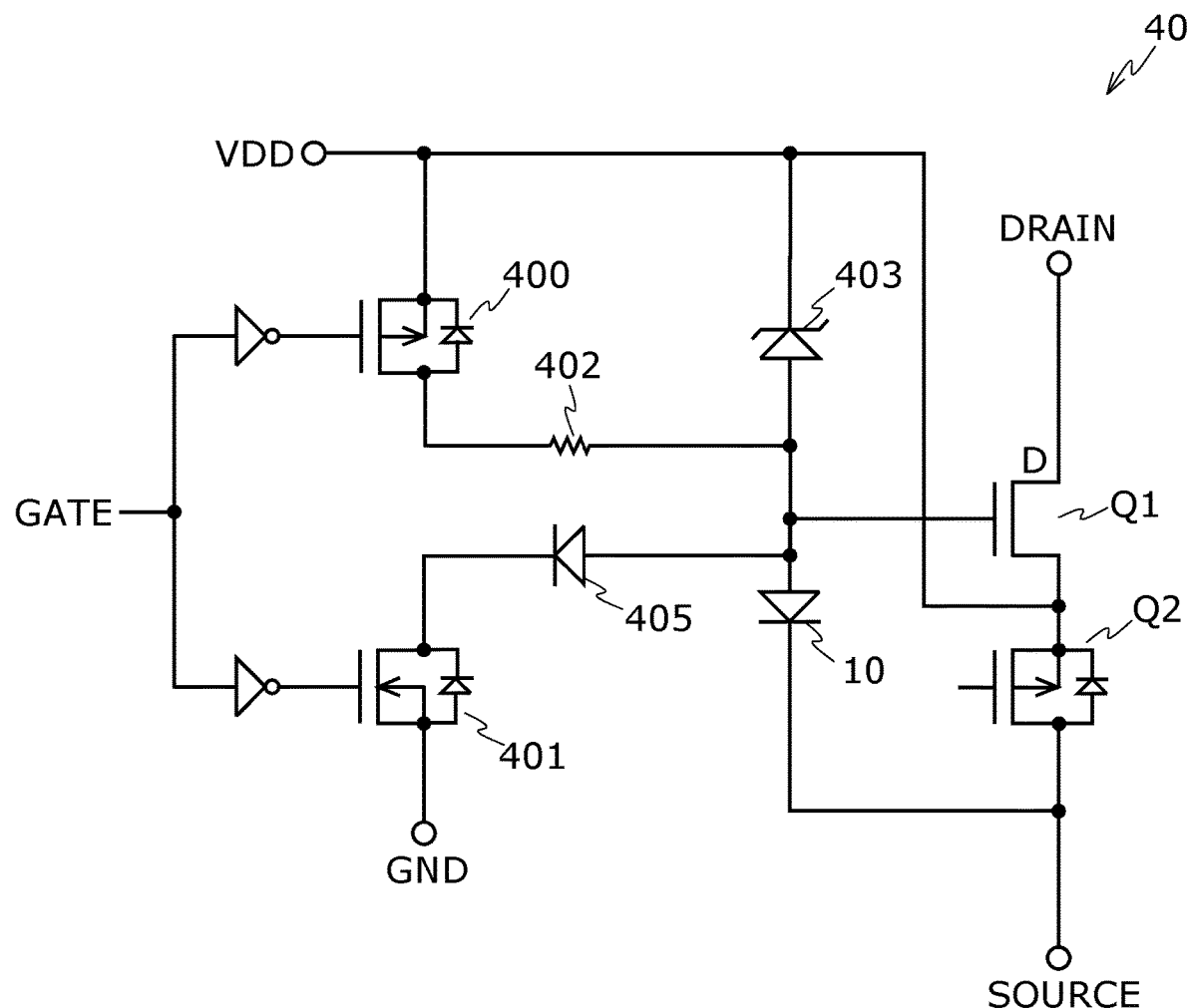
FIG. 12 is a circuit diagram showing an implementation example of the semiconductor device according to the embodiment.

FIG. 12 is a circuit diagram showing another implementation example of the third circuit 40. The third circuit 40 includes the first switch 400, the second switch 401, the sixth resistor 402, the fourth diode 403, and a sixth diode 405.

The first switch 400 is, for example, a p-type MOSFET, where the source is connected with the power supply voltage terminal VDD, the gate is connected to the inverter output, and the inverter input is connected to the gate voltage application terminal GATE.

The second switch 401 is, for example, an n-type MOSFET, where the source is connected with the ground terminal GND, the gate is connected to the inverter output, and the inverter input is connected to the gate voltage application terminal GATE.

The sixth resistor 402 has one end connected with the drain of the first switch 400 and the other end connected with the gate of the first transistor Q1. The sixth resistor 402 operates as a gate resistor that controls the gate current of the first transistor Q1.

The fourth diode 403 has the anode connected with the anode of the first diode 10 and the gate of the first transistor Q1, and the cathode connected with the power supply voltage terminal VDD.

The sixth diode 405 has the anode connected with the gate of the first transistor Q1, and the cathode connected with the drain of the second switch 401.

The current passing through the body diode of the second switch 401 that turns off the first transistor Q1 can be prevented by the sixth diode 405 connected between the second switch 401 and the gate of the first transistor Q1. In the implementation example 4, since the gate resistance is in the gate current paths of both the turn-on and turn-off of the first transistor Q1, it is difficult to independently adjust the drive force, but according to the present implementation example, it becomes possible for the sixth diode 405 alone to adjust the drive force independently by in the gate current paths of the turn-on and turn-off of the first transistor Q1, and it becomes possible to prevent the charge current of the capacitor similarly to the implementation example described above.

Implementation Example 6

Figure 13:
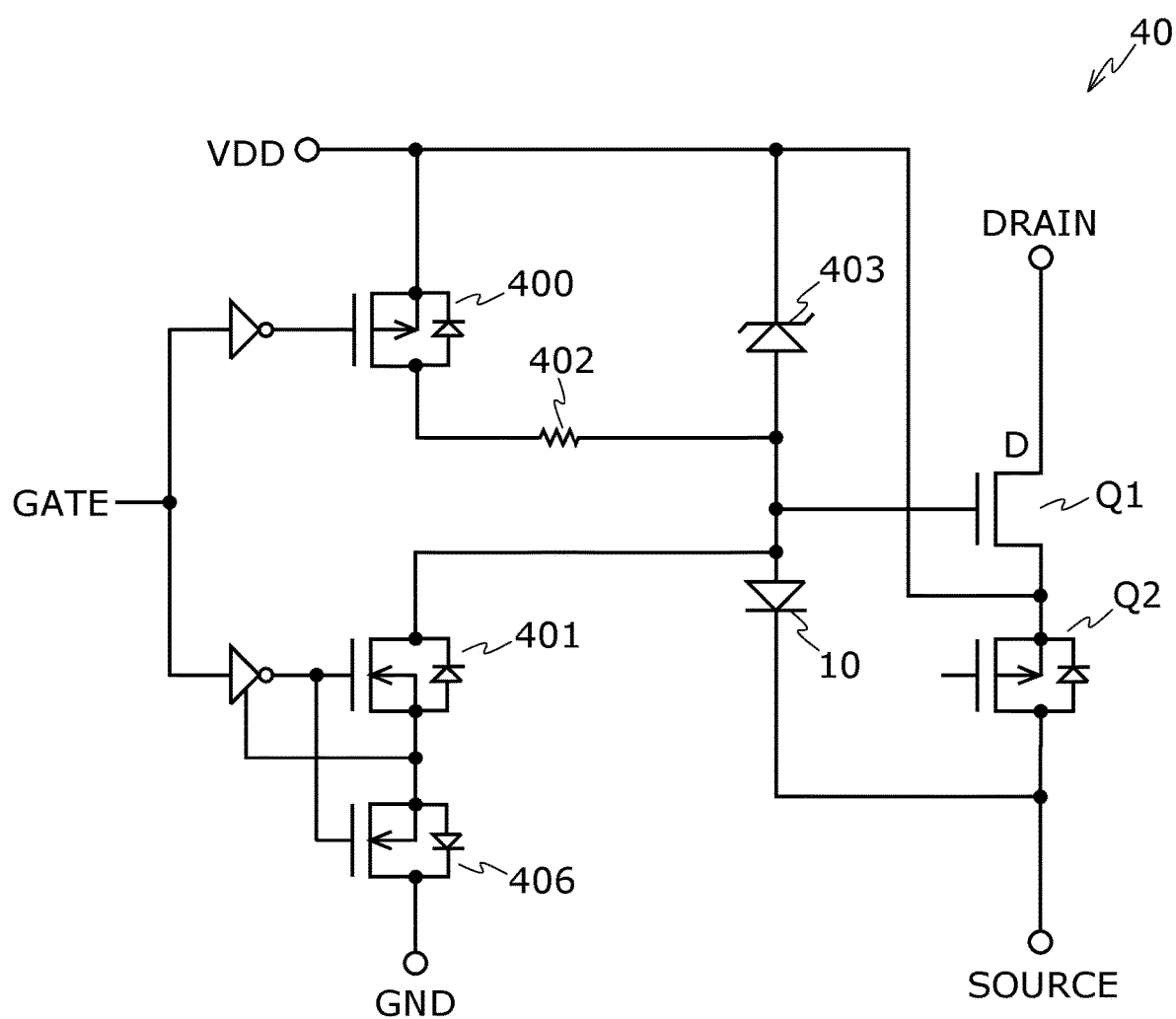
FIG. 13 is a circuit diagram showing an implementation example of the semiconductor device according to the embodiment.

FIG. 13 is a circuit diagram showing another implementation example of the third circuit 40. The third circuit 40 includes the first switch 400, the second switch 401, the sixth resistor 402, the fourth diode 403, and a third switch 406.

The first switch 400 is, for example, a p-type MOSFET, where the source is connected with the power supply voltage terminal VDD, the gate is connected to the inverter output, and the inverter input is connected to the gate voltage application terminal GATE.

The second switch 401 is, for example, an n-type MOSFET, where the source is connected back-to-back with the third switch 406, the gate is connected to the inverter output, and the inverter input is connected to the gate voltage application terminal GATE.

The sixth resistor 402 has one end connected with the drain of the first switch 400 and the other end connected with the gate of the first transistor Q1. The sixth resistor 402 operates as a gate resistor that controls the gate current of the first transistor Q1.

The fourth diode 403 has the anode connected with the anode of the first diode 10 and the gate of the first transistor Q1, and the cathode connected with the power supply voltage terminal VDD.

The third switch 406 is, for example, an n-type MOSFET, where the drain is connected with the ground terminal GND, the gate is connected with the gate voltage application terminal GATE, and the source is connected back-to-back with the source of the second switch 401.

The current passing through the second switch 401 that turns off the first transistor Q1 can be prevented by forming a bidirectional switch by the third switch 406 connected between the second switch 401 and the ground potential. In the above-described implementation example 5, when the first transistor Q1 is turned off, the turn-off drive force is weakened by the forward voltage of the sixth diode 405 in the gate current path, but when the first transistor Q1 is turned off according to the configuration of the present implementation example, this voltage becomes the product of the on-resistance of the third switch 406 and the gate current, and hence the turn-off drive force can be strengthened by using a switch element having a low on-resistance as the third switch 406.

Thus, even when a high voltage slew rate is applied between the drain and the source of the first transistor Q1, the impedance of the turn-off current path by the second switch 401 and the third switch 406 is suppressed low, thereby allowing the first transistor Q1 to be prevented from being erroneously turned on.

According to the embodiment described above, it is possible to make the first transistor Q1 of the normally-on drive the first transistor Q1 of the normally-off drive by appropriately controlling the first transistor Q1 and the second transistor Q2 without increasing the loop of the gate current for driving the first transistor Q1. According to the semiconductor device 1, it becomes possible to form a switch that copes with a high withstand voltage when an external load, e.g., a high voltage of about 140 V to 400 V, is applied, and safely performs a normally-off drive.

In the embodiment described above, the second transistor Q2 is provided outside the semiconductor device 1, but the semiconductor device 1 may be provided with the second transistor Q2. In this case, the semiconductor device 1 may have an output terminal connected with the gate and source of the first transistor Q1 and outputting the drain current of the first transistor Q1.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device that normally-off drives a first transistor that normally-on drives, the semiconductor device comprising:
   a first circuitry that is connected with a power supply voltage and a ground voltage, detects the power supply voltage, and outputs a transition state of the power supply voltage;
   a second circuitry that is connected with the power supply voltage, the ground voltage, the first circuitry, and a second transistor, and outputs a drive voltage of the second transistor connected in series with the first transistor, based on an output of the first circuitry;
   a first diode having an anode connected with a drive terminal of the first transistor and a cathode connected with an output terminal of the second transistor;
   a first resistor connected with the power supply voltage;
   a second diode that is a Zener diode having an anode connected to the ground voltage and a cathode connected to the power supply voltage via the first resistor;
   a third transistor having a gate connected to a cathode of the second diode and a source connected with the power supply voltage;
   a second resistor provided between a drain of the third transistor and the ground voltage;
   a fourth transistor having a gate connected to the drain of the third transistor, a source connected with the power supply voltage, and a drain connected with a gate of the second transistor; and
   a third resistor provided between the drain of the third transistor and the ground voltage.

2. The semiconductor device according to claim 1, wherein
   the first transistor is a field effect transistor (FET) using gallium nitride (GaN) whose source is connected with the power supply voltage, and
   the second transistor is a p-type metal-oxide semiconductor field-effect transistor (MOSFET) whose source is connected with a source of the first transistor.

3. The semiconductor device according to claim 2, comprising:
   a fifth transistor that normally-on drives, the fifth transistor having a drain connected to the power supply voltage and a gate connected with the ground voltage; and
   a third diode that is a Zener diode having an anode connected to the ground voltage and a cathode connected with a source of the fifth transistor and a gate of the second transistor.

4. The semiconductor device according to claim 2, wherein
   the first circuitry includes
   a reference voltage generation circuitry that generates a reference voltage, and
   a voltage comparison circuitry that compares the reference voltage with a power supply voltage, and
   the second circuitry includes
   an output buffer that controls an output of the voltage comparison circuitry to apply the output to a gate of the second transistor.

5. The semiconductor device according to claim 2, further comprising:
   a third circuitry that is connected to a gate of the first transistor, prevents a capacitive charge current at a timing when the power supply voltage is input, and controls a drive voltage.

* * * * *